United States Patent
Phua et al.

(10) Patent No.: US 7,084,025 B2
(45) Date of Patent: Aug. 1, 2006

(54) SELECTIVE OXIDE TRIMMING TO IMPROVE METAL T-GATE TRANSISTOR

(75) Inventors: Timothy Wee Hong Phua, Singapore (SG); Kheng Chok Tee, Singapore (SG); Liang Choo Hsia, Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 194 days.

(21) Appl. No.: 10/885,855

(22) Filed: Jul. 7, 2004

(65) Prior Publication Data
US 2006/0008973 A1    Jan. 12, 2006

(51) Int. Cl.
*H01L 21/8238*  (2006.01)
*H01L 21/8234*  (2006.01)
*H01L 21/305*   (2006.01)
*H01L 21/4763*  (2006.01)

(52) U.S. Cl. .............. 438/199; 438/231; 438/275; 438/591

(58) Field of Classification Search .......... 438/197, 438/199, 229–232, 265, 216, 258, 261, 275–276, 438/279, 287, 585, 587, 591
See application file for complete search history.

(56) References Cited

U.S. PATENT DOCUMENTS

| | | | |
|---|---|---|---|
| 4,920,076 A | 4/1990 | Holland et al. | |
| 5,489,546 A | 2/1996 | Ahmad et al. | |
| 5,849,616 A | 12/1998 | Ogoh | |
| 5,918,116 A | 6/1999 | Chittipeddi | |
| 6,258,680 B1 | 7/2001 | Fulford, Jr. et al. | |
| 6,281,559 B1 * | 8/2001 | Yu et al. | 257/407 |
| 6,316,302 B1 | 11/2001 | Cheek et al. | |
| 6,333,249 B1 | 12/2001 | Kim et al. | |
| 6,451,704 B1 | 9/2002 | Pradeep et al. | |
| 6,534,352 B1 | 3/2003 | Kim | |
| 2005/0148131 A1 * | 7/2005 | Brask | 438/199 |
| 2005/0247986 A1 * | 11/2005 | Ko et al. | 257/411 |

* cited by examiner

*Primary Examiner*—Thanhha Pham
(74) *Attorney, Agent, or Firm*—William J. Stoffel

(57) ABSTRACT

A process to form a FET using a replacement gate. An example feature is that the PMOS sacrificial gate is made narrower than the NMOS sacrificial gate. The PMOS gate is implanted preferably with Ge to increase the amount of poly sacrificial gate that is oxidized to form PMOS spacers. The spacers are used as masks for the LDD Implant. The space between the PLDD regions is preferably larger that the space between the NLDD regions because of the wider PMOS spacers. The PLDD tends to diffuse readily more than NLDD due to the dopant being small and light (i.e. Boron). The wider spacer between the PMOS regions improves device performance by improving the short channel effects for PMOS. In addition, the oxidization of the sacrificial gates allows trimming of sacrificial gates thus extending the limitation of lithography. Another feature of an embodiment is that a portion of the initial pad oxide is removed, thus reducing the amount of undercut created during the channel oxide strip for the dummy gate process. This would improve on the gate overlap capacitance for a T-gate transistor. In a second embodiment, two metal gates with different work functions are formed.

41 Claims, 15 Drawing Sheets

SELECTIVE OXIDE TRIMMING TO IMPROVE METAL T-GATE TRANSISTOR

BACKGROUND OF INVENTION

1) Field of the Invention

This invention relates generally to fabrication of semiconductor devices and more particularly to the fabrication of a FET with a metal gate.

2) Description of the Prior Art

The advancement in transistor technology has led to numerous emerging issues. Gate oxide is one of the most aggressively scaled parameter to maintain the Moore's Law. ITRS 2001 has shown that by 2005, the current $SiO_2$ material could have reached an unacceptable gate leakage with decreasing oxide thickness. Hence, new material is needed to replace silicon dioxide by then.

Currently, the semiconductor workers are hot on the heels in search of new materials, the more promising ones at this point in time is High K materials (HfO and ZrO, etc). High K materials would provide a lower EOT for a given thickness which would reduce the stringent requirement compared to silicon dioxide in terms of thickness requirement. The need for High K material is therefore low power driven and not high performance driven. In addition, lithography is also another challenging area whereby gate length is scaled aggressively too. One of the methods to extend the limitation of lithography in the sub-micron gate era is to perform resist trimming.

Another scaling issue would be the polysilicon gate/$SiO_2$ system. If silicon dioxide continues to grow thinner, the poly depletion effect causes higher EOT and aggravates short channel effects. The gate capacitance and the saturation current would be reduced. These would make current silicon dioxide material seems almost impossible for future transistor technology. Therefore, alternatives are currently being sought after. One of the promising candidates would be the metal gate technology. Materials for metal gate are currently been looked into. Metal gates do not exhibit the poly depletion effects but are low power consumption, higher drive current capability and higher speed due to lower gate resistance.

SUMMARY OF THE INVENTION

An example embodiment of the present invention provides a method of manufacturing a FET which is characterized as follows.

forming a bottom pad dielectric layer and a polysilicon layer over a substrate; said bottom pad dielectric layer has a first thickness;

patterning the polysilicon layer to form a sacrificial gate; performing a sacrificial gate amorphization implant by implanting ions into said sacrificial gate to form an amorphous layer;

thermally oxidizing said sacrificial gate, and said amorphous layer to form sacrificial spacers on the sidewalls of said sacrificial gate;

performing a LDD implant form to LDD regions adjacent to said sacrificial gate;

in a bottom pad dielectric thinning step, removing the sacrificial spacers and removing a thickness of said bottom pad dielectric layer so that said bottom pad dielectric layer has a second thickness;

forming spacers on said sacrificial gate;

performing a S/D implant to form S/D regions adjacent to said sacrificial gate;

forming a dielectric layer over said substrate;

planarizing said dielectric layer to expose said sacrificial gate;

removing said sacrificial gate to form a gate opening that expose portions of said bottom pad dielectric layer;

removing the exposed portion of said bottom pad dielectric layer in said gate opening;

forming a gate dielectric layer on said substrate in said gate opening;

forming a gate layer in said gate openings over said gate dielectric layer; planarizing said gate layer to form a gate.

The above and below advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 to 14 and 18 to 23 show a second embodiment where two metal gates with different work functions are formed.

FIGS. 25A-1, 25A-2, 25B, 25C, and 25D are cross sectional views of an example embodiment showing a process that reduces the under cutting of the pad dielectric layer.

DETAILED DESCRIPTION OF THE EXAMPLE EMBODIMENTS

I. Overview

Example embodiments of the invention show a process to form a FET using a replacement gate process. The process and parameters are examples. The exact process and parameters can be modified as technology evolves and as known to those skilled in the art.

FIGS. 1 to 17 show a first embodiment of the invention.

A feature is that the PMOS sacrificial gate is made thinner than the NMOS sacrificial gate. The PMOS gate is implanted preferably with Si or Ge to increase the amount of poly sacrificial gate that is oxidized to form PMOS spacers. The spacers are used as masks for the LDD (lightly doped drain) Implant. The distance (e.g., width of sacrificial gate) between the PLDD regions is larger that the space between the NLDD regions because of the wider PMOS spacers. The PLDD tends to diffuse readily more than NLDD due to the dopant being small and light (e.g., Boron). The wider spacer between the PMOS regions improves device performance by improving the short channel effects for PMOS.

In addition, the oxidization of the sacrificial gates trims the sacrificial gates thus extending the limitation of lithography.

Another feature is that this trimming oxide is stripped away. During this controllable stripping, some of the initial pad oxide would also be stripped, thus reducing the amount of undercut created during the channel oxide strip for the dummy gate process. This would improve on the gate overlap capacitance for a T-gate transistor.

In a second embodiment shown in FIGS. 1 to 14 and 18 to 23, two metal gates with different work functions are formed.

II. First Example Embodiment

Figure 1:
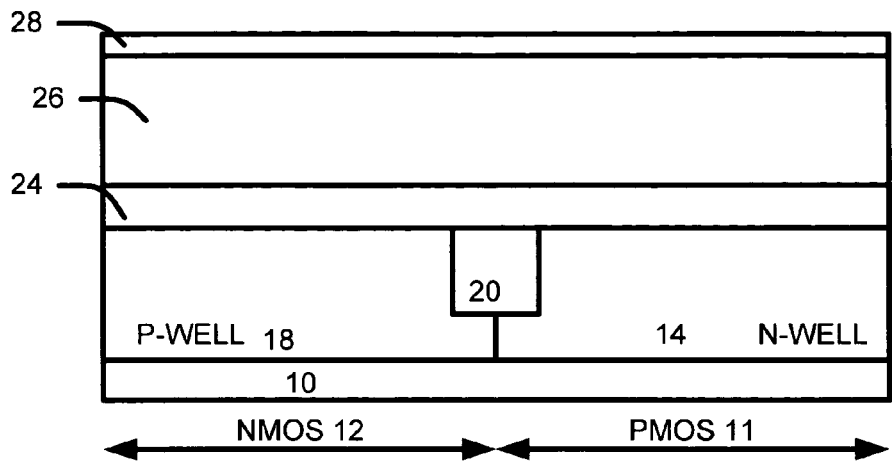
FIGS. 1 through 17 are cross sectional views for illustrating a first embodiment of the invention.

Referring to FIG. 1, we form a n-well 14 in PMOS area 11 and a p-well 18 in a NMOS area 12 in a substrate 10. The substrate can be silicon wafer and other substrate using in semiconductor manufacturing.

Next, we form isolation regions 20 in the substrate 10. The isolation regions are preferably shallow trench isolation (STI) regions.

We then form a bottom pad dielectric layer 24, a silicon containing layer (e.g., polysilicon layer) 26 and a hard mask layer 28 over the substrate. The polysilicon layer preferably contains polysilicon. The polysilicon layer can be comprised of polysilicon, amorphous silicon or SiGe.

The bottom pad dielectric layer 24 is preferably comprised of oxide and has a thickness between 50 and 400 Å.

The silicon containing layer (e.g., polysilicon layer) 26 preferably has a thickness between 1000 and 2000 Å.

The hard mask layer 28 is preferably comprised of nitride. The hard mask layer is used for obtaining good contrast for obtaining gate CD. The hark mask layer improves on Salicide process and must be thick enough for the oxynitride spacer etch subsequently.

Figure 2:
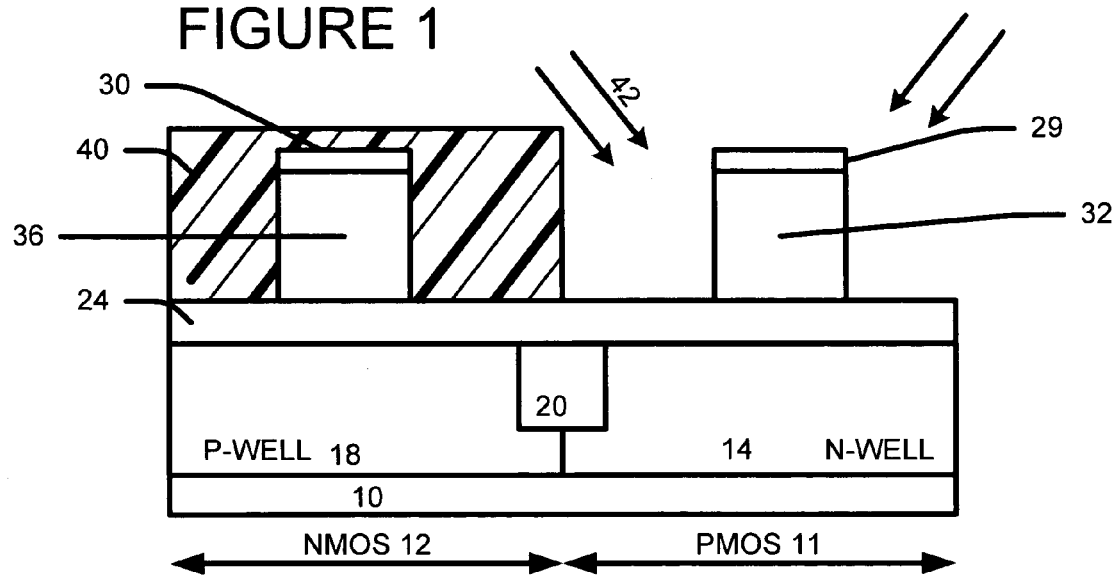

Form PMOS Sacrificial Gate and PMOS Hard Mask and NMOS Sacrificial Gate and NMOS Hard Mask Referring to FIG. 2, we pattern the polysilicon layer 26 and the hard mask layer 28 to form PMOS sacrificial gate 32 and PMOS hard mask 29 and NMOS sacrificial gate 36 and NMOS hard mask 30.

Still referring to FIG. 2, we form a PMOS Mask 40 over substrate with opening(s) over the PMOS area 11. The PMOS mask 40 is preferably comprised of photoresist.

As shown in FIG. 2, we perform a PMOS sacrificial gate amorphization implant to amorphize outer portions 32A (e.g., amorphous layer 32A) of the PMOS sacrificial gate 32.

Figure 2A:
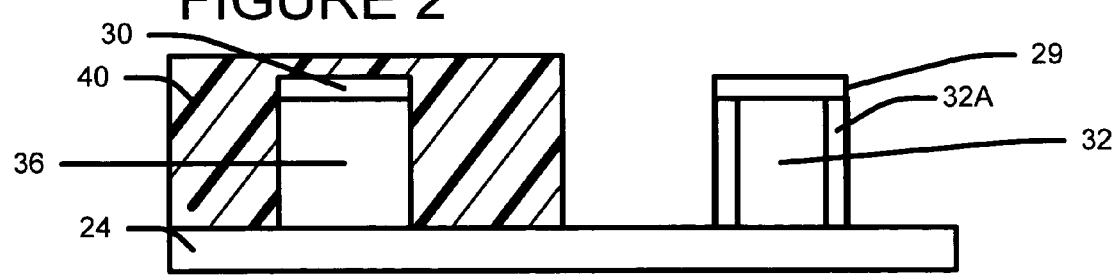
FIG. 2A is a cross sectional view of the PMOS gate after the amorphizing implant.

As shown in FIG. 2A, the amorphous Si outer portion 32A of Polysilicon PMOS sacrificial gate 32 preferably has a thickness between 25 and 2500 Å. If the amorphizing implant uses Ge, the amorphous Si outer portion 32A preferably has a Ge concentration between 1E13 and 1E20 atom/cc.

The implant amorphizes the poly 32 to enhance a subsequent poly oxidation that reduces the size of the subsequently formed PMOS gate.

The Ge or Si Angled Implant 42 can preferably comprise Ge or Si ions.

Trim Gates

Figure 3:
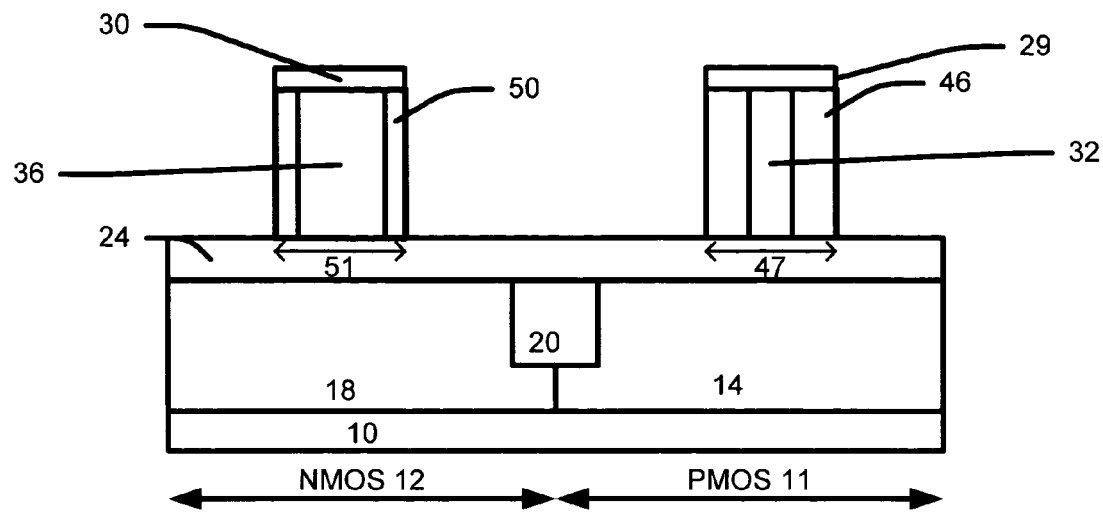

Referring to FIG. 3, we remove the PMOS Mask 40.

Still referring to FIG. 3, we trim the gates preferably by oxidation. Preferably we thermally oxidize the PMOS sacrificial gate 32 and NMOS sacrificial gate 36 to form NMOS sacrificial spacers 50 on the sidewalls of the NMOS sacrificial gate 36 and PMOS sacrificial spacers 46 on the sidewalls of the PMOS sacrificial gate 32.

The PMOS sacrificial spacers 46 are thicker than the NMOS sacrificial spacers 50 because the oxidation rate of the amorphous Si 32A on the PMOS gate 32 is faster than the NMOS polysilicon gate.

Preferably the PMOS sacrificial spacers 46 are preferably between 100 and 500% thicker than the NMOS sacrificial spacers 50.

The NMOS sacrificial spacers 50 can have a thickness between 50 and 2500 Å and more preferably between 50 and 500 Å. The PMOS sacrificial spacers 46 can have a thickness between 100 and 5000 Å and more preferably between 100 and 500 Å.

The PMOS sacrificial spacers 46 are preferably thicker than the NMOS sacrificial spacers 50.

By oxidizing the sacrificial gate sidewall, we can further reduce the gate length. This can be an combined with or be an alternate technique to resist trimming to extend the limit of lithography.

The NMOS spacer/gate width 51 is preferably between 120 and 3400 Å and more preferably 500 and 1800 Å. The PMOS spacer/gate width 47 is preferably between 220 and 3500 Å and more preferably 700 and 1800 Å. These widths are about the initial space between the LDDs.

Depending on the technology, the PMOS spacer/gate width 47 are preferably between 20 and 40% wider than the NMOS spacer/gate width 51.

The PMOS gate 32 has a width preferably between 120 and 3500 Å.

The NMOS gate 36 has a width preferably between 120 and 3500 Å and more preferably between 120 and 1300 Å.

The PMOS gate 32 preferably has a narrower width than the width of the NMOS gate.

The PMOS gate 32 has a thickness preferably between 5 and 100% the thickness of the NMOS gate.

The PMOS gate 32 has a thickness preferably between 5 and 50% the thickness of the NMOS gate.

FIG. 4

Figure 4:
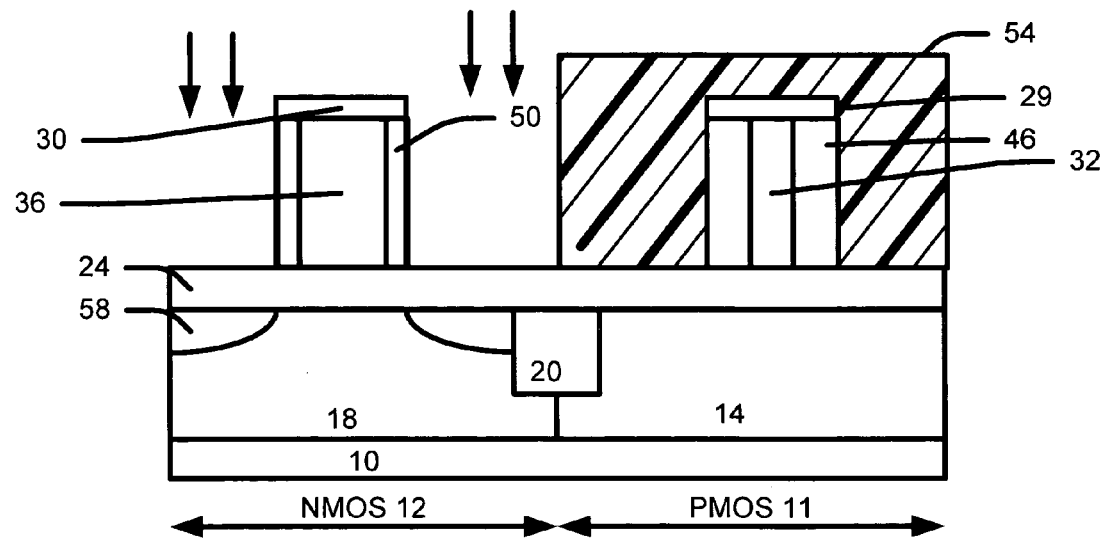

As shown in FIG. 4, we form a NMOS LDD Mask 54 over the substrate with openings over the NMOS area 12.

Referring to FIG. 4, we then perform a NMOS LDD implant to form N-LDD regions 58 adjacent to the NMOS sacrificial gate 36. The N-LDD regions are preferably doped with As or P.

Next, preferably we perform a pocket implant preferably using Boron or Indium ions in the NMOS area 12 to form pocket NMOS regions (not shown).

Figure 5:
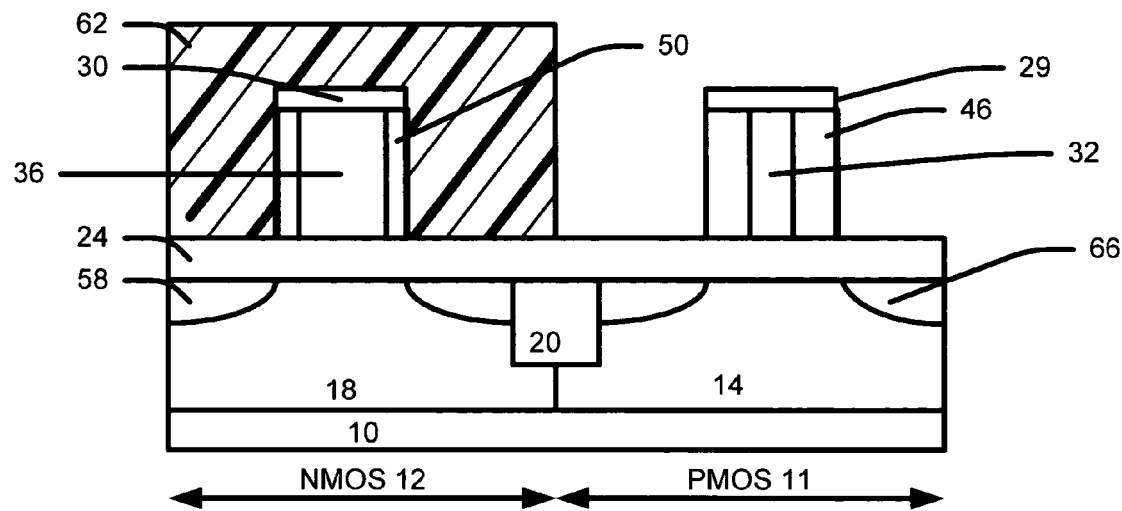

Referring to FIG. 5, we remove the NMOS LDD Mask 54.

Subsequently, we form a PMOS LDD Mask 62 over the substrate with opening over the PMOS area 11.

We then perform a PMOS LDD implant to P-LDD regions 66 adjacent to the PMOS sacrificial gate 36. The P-LDD regions 66 preferably have a Boron concentration between 1E13 and 5E15 atom/cc.

We perform a pocket implant in the PMOS area 11 to from PMOS pocket regions (Not shown).

Figure 6:
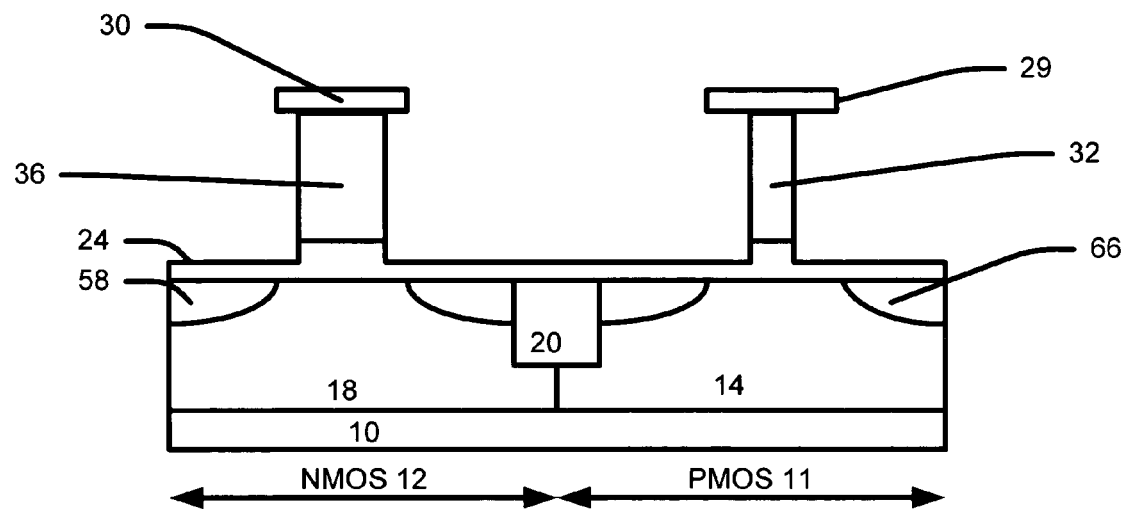

Referring to FIG. 6, we remove the PMOS LDD Mask 62.

In a FIG. 6, in a key step (e.g., pad dielectric thinning step), we remove the PMOS spacers 46 and NMOS spacers 50 and portions of the remaining dielectric layer 24. The etch is preferably comprised of wet etch using dilute HF.

Preferably the pad dielectric thinning step removes between 30 and 80% of the pad dielectric thickness.

Before the thinning etch, the pad layer 24 preferably has a thickness between 50 and 400 Å. After the thinning etch, preferably the pad dielectric layer preferably has a thickness between 20 and 120 Å.

The etch of the spacers 46 and pad dielectric layer 24 is controllable because the thickness of the pad dielectric layer 24 can be controlled to obtain the desired thickness by the slow HF etch. The thinner layer 24 in the region not under the gate, the lesser the undercut of the pad dielectric layer 24 in the channel oxide strip. (See FIGS. 25A, 25B, 25C. This reduces undercut of the oxide 24 under the sacrificial gates 36 32 during the Channel Oxide Strip. This lowers the $C_{ovl}$—(gate overlap capacitance).

A feature is that during this controllable stripping of the this trimming oxide; some of the initial pad oxide layer 24 would also be stripped, thus reducing the amount of undercut created during the channel oxide strip for the dummy gate process. This would improve on the gate overlap capacitance for a T-gate transistor.

Figure 7:
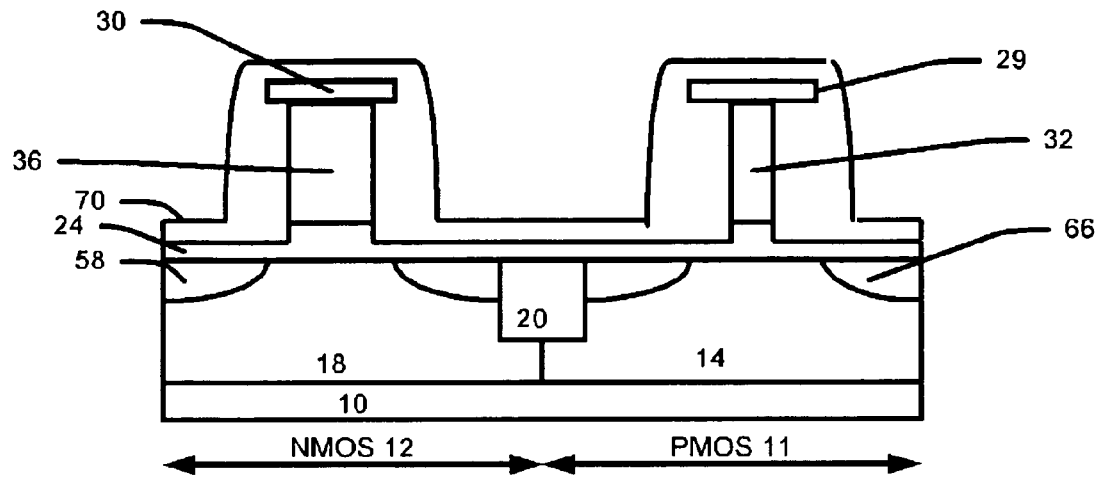

Referring to FIG. 7, we form a spacer dielectric layer 70 over the substrate 10. The spacer dielectric layer 70 preferably has a thickness between 50 and 5000 Å. The spacer dielectric layer is preferably comprised of silicon oxynitride.

Figure 8:
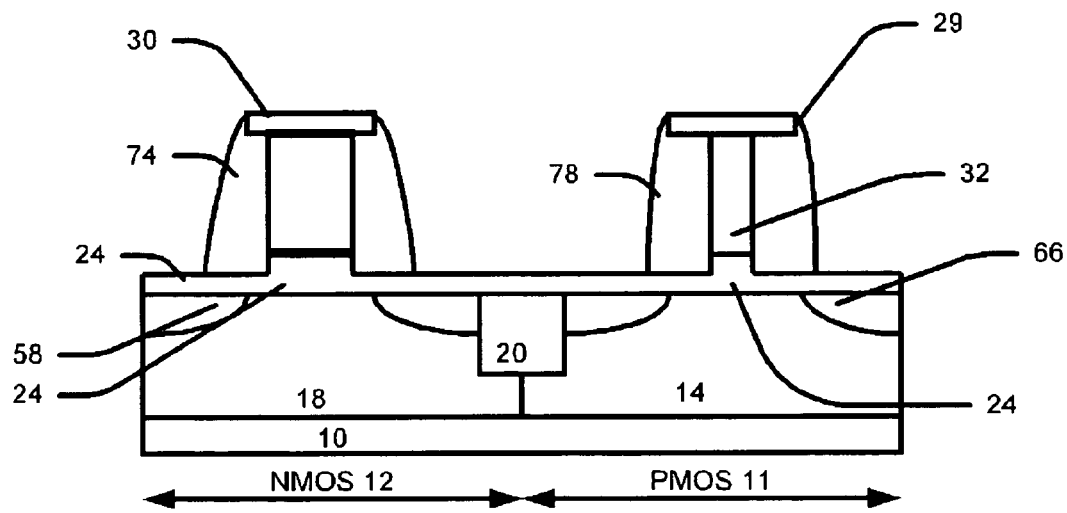

As shown in FIG. 8, we anisotropically etch the spacer dielectric layer 70 to form NMOS spacers 74 on the NMOS sacrificial gate 36 and PMOS spacers 78 on the PMOS sacrificial gate 32.

Figure 9:
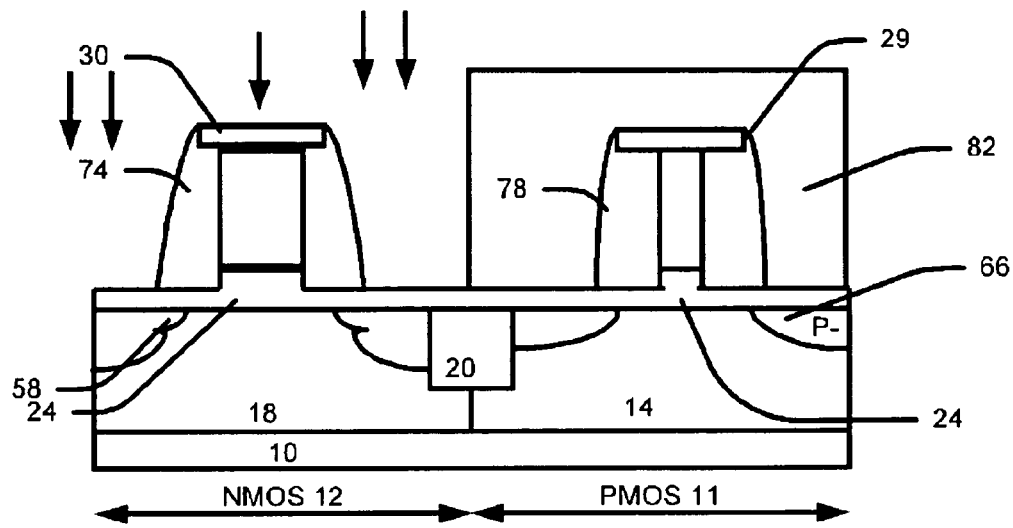

As shown in FIG. 9, we form a NMOS S/D (source/drain) mask 82 having openings over the NMOS area 12.

We then perform a NMOS S/D implant to form NMOS S/D regions 86 adjacent to the NMOS sacrificial gate 36.

We then remove the NMOS S/D mask 82.

Figure 10:
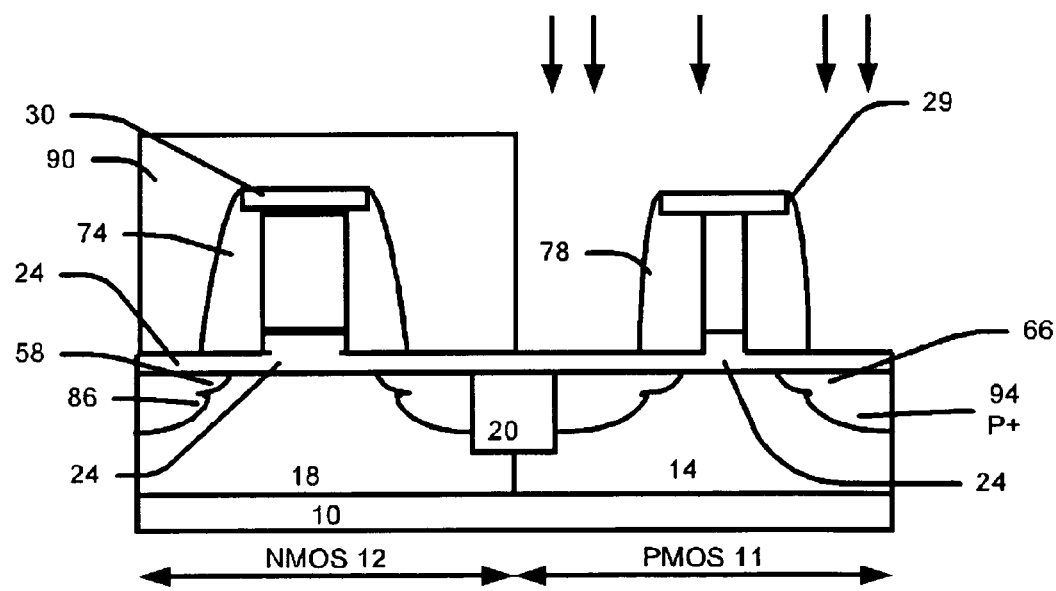

Referring to FIG. 10, we form a PMOS S/D mask 90 having openings over the PMOS area 11.

We perform a PMOS S/D implant to form PMOS S/D regions 94 adjacent to the PMOS sacrificial gate 32. The PMOS S/D region are preferably doped with B with a concentration between 1E13 and 1E15 atom/cc.

An S/D anneal is preferably performed to activate the dopants for both NMOS and PMOS areas. During the anneal, the NMOS LLD 58 laterally diffuses a distance 58A and the PMOS LDD 66 laterally diffuses a distance 66A. Distance 66A is normally greater than distance 58A since P-type dopants (e.g., Boron) typically diffuse faster than n-type dopant (e.g., As).

Figure 11:
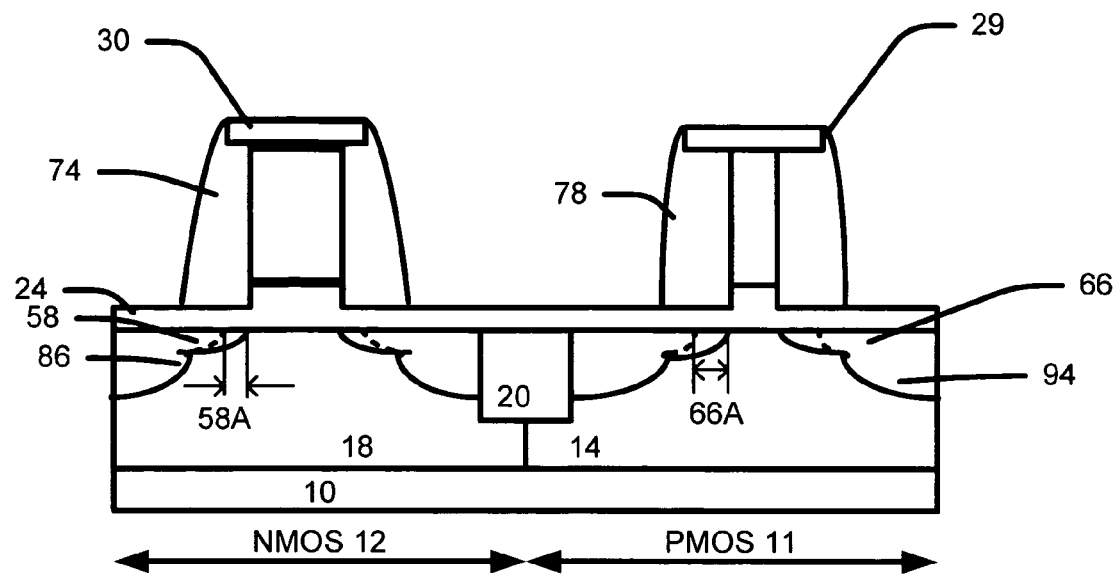

As shown in FIG. 11, we remove the PMOS S/D mask 90.

Figure 12:
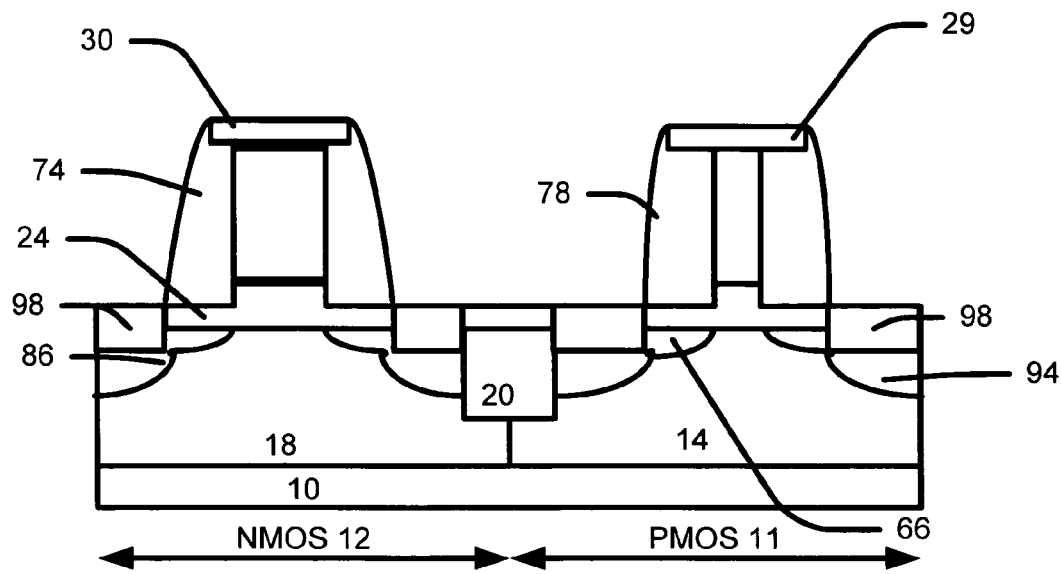

As shown in FIG. 12, we form silicide 98 on the PMOS S/D regions and NMOS S/D regions.

Figure 13:
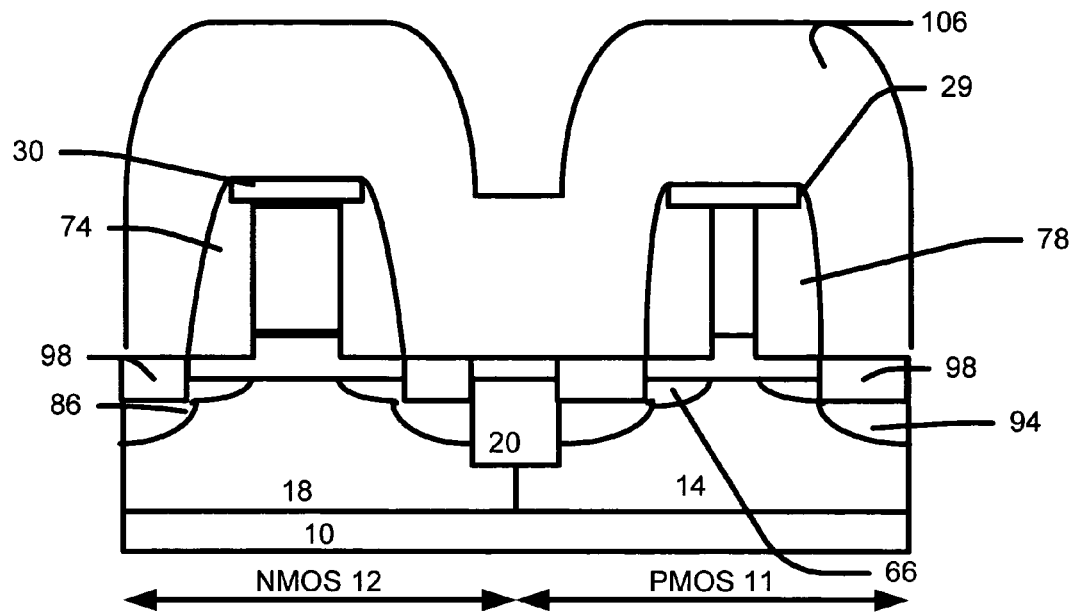

As shown in FIG. 13, we form a dielectric layer (e.g., poly metal dielectric (PMD) layer) 106 over the substrate. The PM (poly metal) dielectric layer 106 preferably has a thickness between 10,000 and 20,000 Å.

Figure 14:
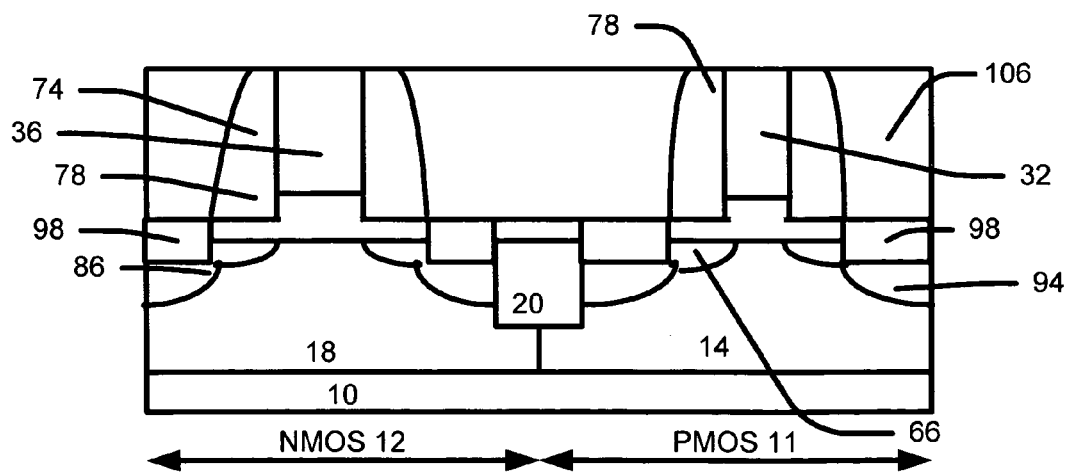

As shown in FIG. 14, we planarize the PM dielectric layer 106 and at the same time can remove the PMOS hard mask 29 and the NMOS hard mask 30 to expose the PMOS sacrificial gate 32 NMOS sacrificial gate 36. The planarization is preferably a chemical-mechanical polish (CMP). The CMP preferably stops on the hard masks 30, 29 and then polishes off the hard masks 30, 29 (e.g., nitride).

Figure 15:
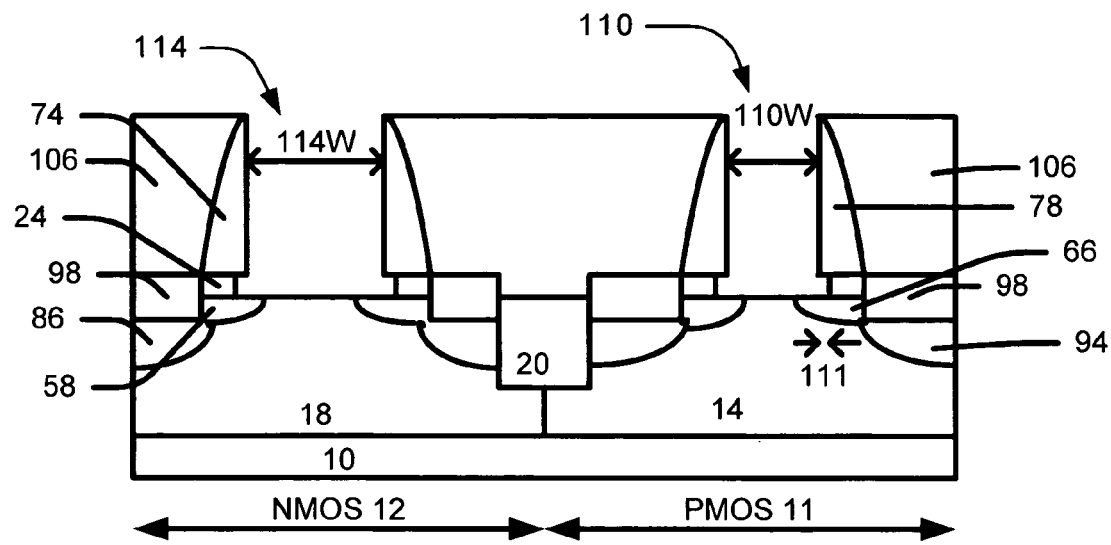

Referring to FIG. 15, we remove the PMOS sacrificial gate 32 and NMOS sacrificial gate 36 to for gate openings 114, 110 that expose portions of the bottom pad dielectric layer 24. The gate opening 114 has a width 114 W. The gate opening 110 has a width 110 W. The PMOS sacrificial gate 32 NMOS sacrificial gate 36 are preferably removed using an etch.

In a channel oxide strip, we remove the exposed portions of the bottom pad dielectric layer 24 in the gate openings 114, 110 to expose the substrate 10. The openings are over the channel region of the subsequently formed T-gate transitors.

During the prior spacer 50, 46 strip step shown in FIG. 6, the initial pad oxide 24 was etched and made thinner. Because of the thinner pad oxide 24 under spacers 74, 78, the undercut 111 is reduced, hence improvement of T-Gate transistor overlap capacitance. Overlap capacitance is created by the overlap between the SD (and/or SDE (source drain extension)) and gate.

The channel oxide strip is a preferably a wet HF etch.

The isotropic channel oxide strip preferably undercuts 111 only between 20 Å and 120 Å of the dielectric 12 under the spacer.

Figure 16:
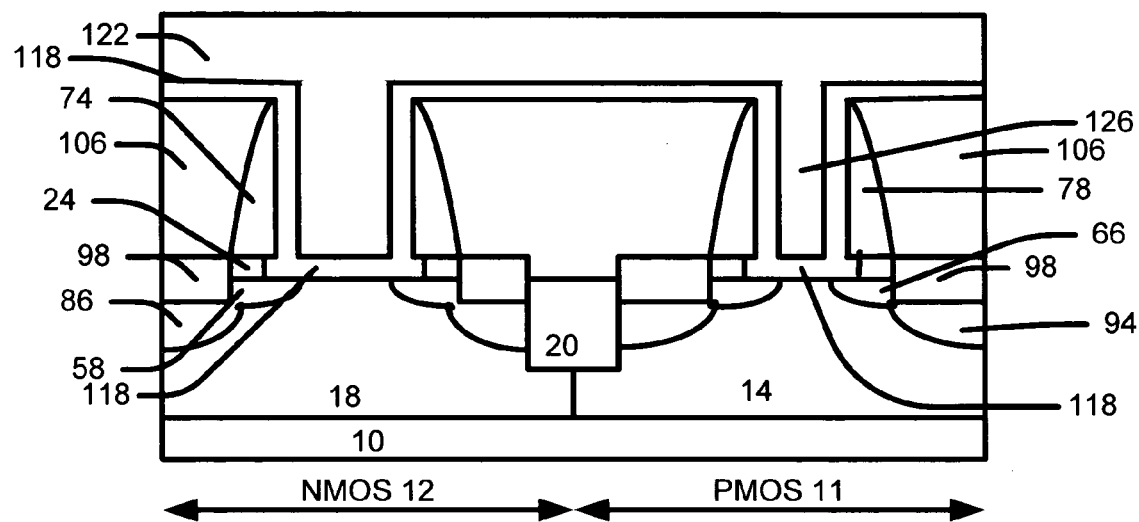

Referring to FIG. 16, we form a gate dielectric layer 118 on the substrate 10 in the gate openings 114, 110.

The gate dielectric layer is preferably comprised of a High K material or an oxide.

Then we form a (e.g., metal) gate layer 122 in the gate openings over the gate dielectric layer 118.

The (metal) gate layer 122 formed by a CVD process and is preferably comprised of a metal, W, TiN, $TiSi_2$, $CoSi_2$, NiSi or HfN.

Figure 17:
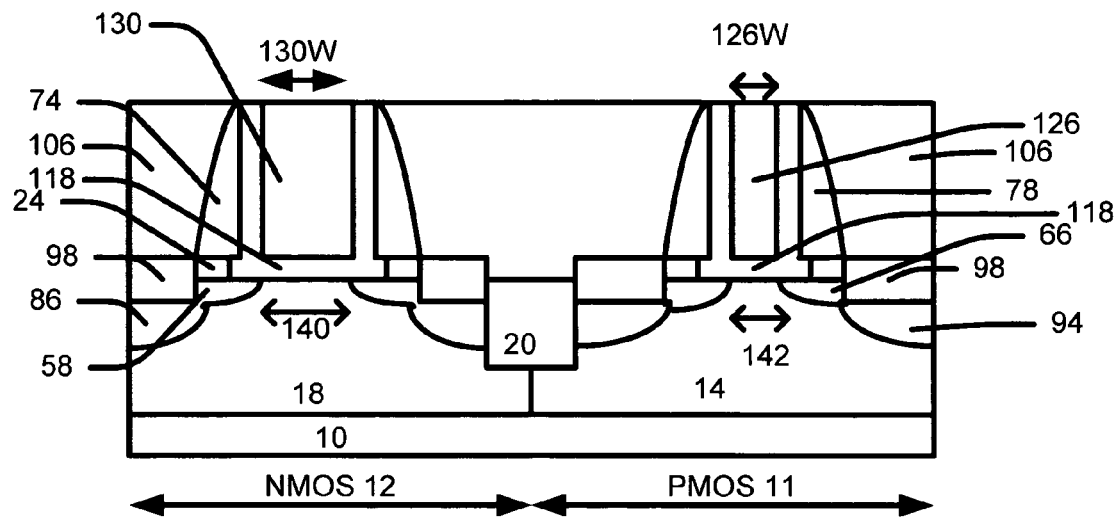

As shown in FIG. 17, we planarize the gate layer 122 preferably using a chemical-mechanical polish (CMP) process to form a PMOS gate 126 and a NMOS gate 130.

The PMOS gate 126 is narrower than the NMOS gate 130 because of the enhanced oxidation of the PMOS sacrificial gate 32 during the trimming step.

For example the PMOS gate 126 can have a width 126 W between 100 and 3500 Å and more preferably between 250 and 1200 Å. The NMOS gate 130 can have a width 130 W between 100 and 3500 Å and more preferably between 450 and 1300 Å.

The distance 140 between the LDDs is preferably between about 100 and 3500 Å and more preferably between 450 and 1300 Å. The distance 142 between the LDDs 66 is preferably between about 100 and 3500 Å and more preferably between 250 and 1200 Å.

The NMOS gate 130 preferably has a width 130 W between 120 and 3500 Å and more preferably between 450 and 1300 Å. The PMOS gate 126 preferably has a width 126 W between 100 and 3400 Å and more preferably between 250 and 1200 Å.

For example, the PMOS gate width 126 W is preferably between −5 and 50% narrower than the NMOS gate width 130 W and is most preferably between 5 and 30% narrower.

Example Features of the First Embodiment

The embodiment has steps that form a narrower PMOS gate 126 by that could include, for example:

Referring to FIG. 2, the amorphous implant of PMOS sacrificial gate 32 to using increase the oxidation rate of the PMOS sacrificial gate 32 with respect to the NMOS sacrificial gate 26. Poly with Ge doping has increase oxidation rate of about 2.4 times that of poly silicon.

Referring to FIG. 3, the oxidation of the partially amorphous PMOS dummy gate 32 to narrow or trim the sacrificial PMOS gate 32. The PMOS spacers 46 are wider than the NMOS spacers 50. Therefore the PMOS LDD regions are spaced wider apart than the NMOS LDD region (See FIGS. 4 and 5). The increased spacing of the PMOS LDD improves the short channel effects due to the reduction in lateral diffusion of the PMOS LDD.

The subsequently formed PMOS gate 126 is narrower than the NMOS gate 130.

A feature is that during this controllable stripping of the this trimming oxide; some thickness of the initial pad oxide layer 24 would also be stripped, thus reducing the amount of undercut created during the channel oxide strip for the dummy gate process. This would improve on the gate overlap capacitance for a T-gate transistor.

III. Second Example Embodiment—Dual Work Function Metal Gate

FIGS. 1 to 14 and FIGS. 18 to 23 show an embodiment with an optional dual work function metal gate process flow. The embodiment forms two types of gate comprised of different materials. For example, FIG. 23 shows a NMOS gate 240 that can be made of a different metal than PMOS gate 212.

The process flow is basically the same as the first embodiment as shown in FIGS. 1 to 14.

Figure 18:
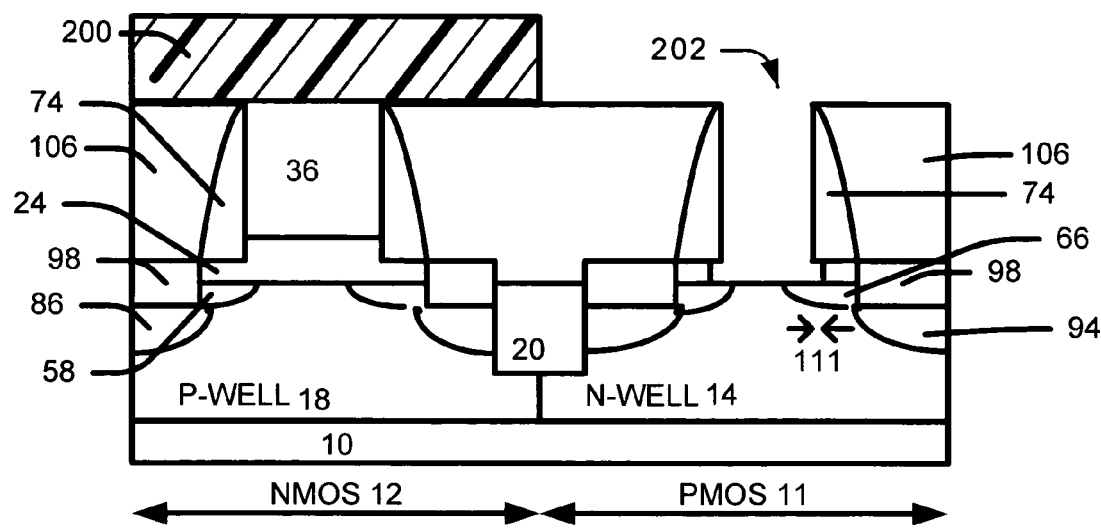

Referring to FIG. 18, we form a PMOS poly etch mask 200 having an PMOS poly opening over the PMOS area 11. The etch mask 200 is preferably comprised of photoresist.

As shown in FIG. 18, we remove the PMOS sacrificial gate 32 and portions of the bottom pad dielectric layer 24 to form a PMOS gate openings 202 that exposes portions of the bottom pad dielectric layer 24.

Then we remove the exposed portions of the bottom pad dielectric layer 24 in the PMOS gate openings 202. As noted above in the description of the first example embodiment, the undercut 111 is small because the pad dielectric was thinned in an earlier etch step.

Figure 19:
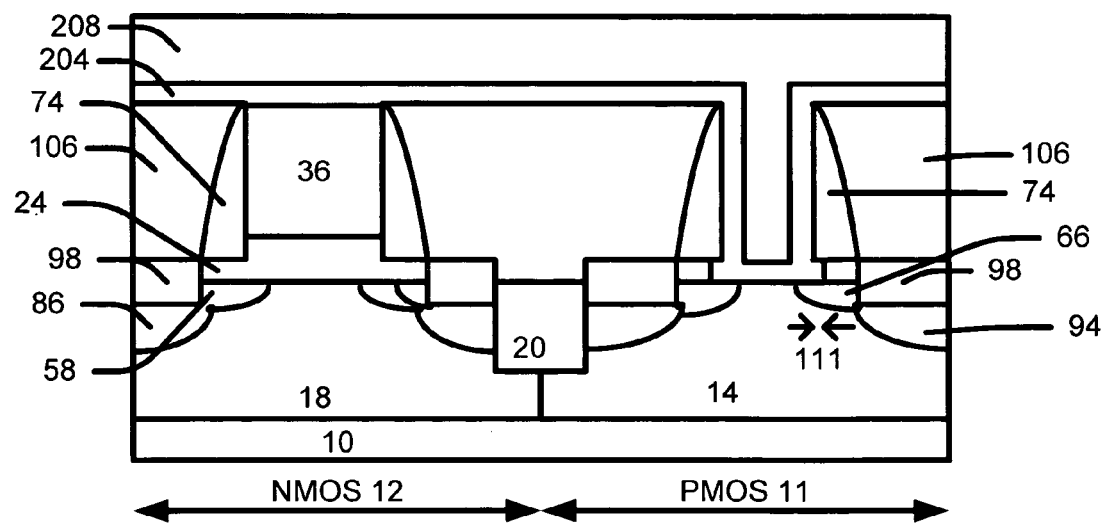

Referring to FIG. 19, we form a PMOS gate dielectric layer 204 over the substrate in the gate openings 202.

We then form a first metal layer 208 filling the PMOS gate openings 202. The first metal layer 208 is preferably comprised of W, TiN, TiSi$_2$, CoSi2, or NiSi. The first metal preferably has a high work function.

Figure 20:
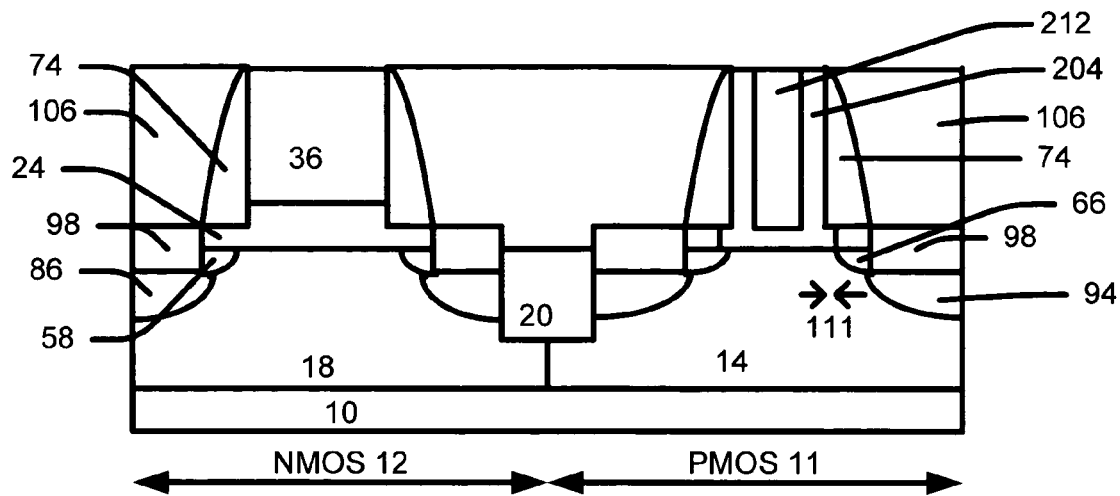

As shown in FIG. 20, we planarize the first metal layer 208 to form a PMOS gate 212 in the PMOS gate openings 202. The first metal layer is preferably chemical-mechanical polished (CMP) stopping on the PM dielectric layer 106.

Figure 21:
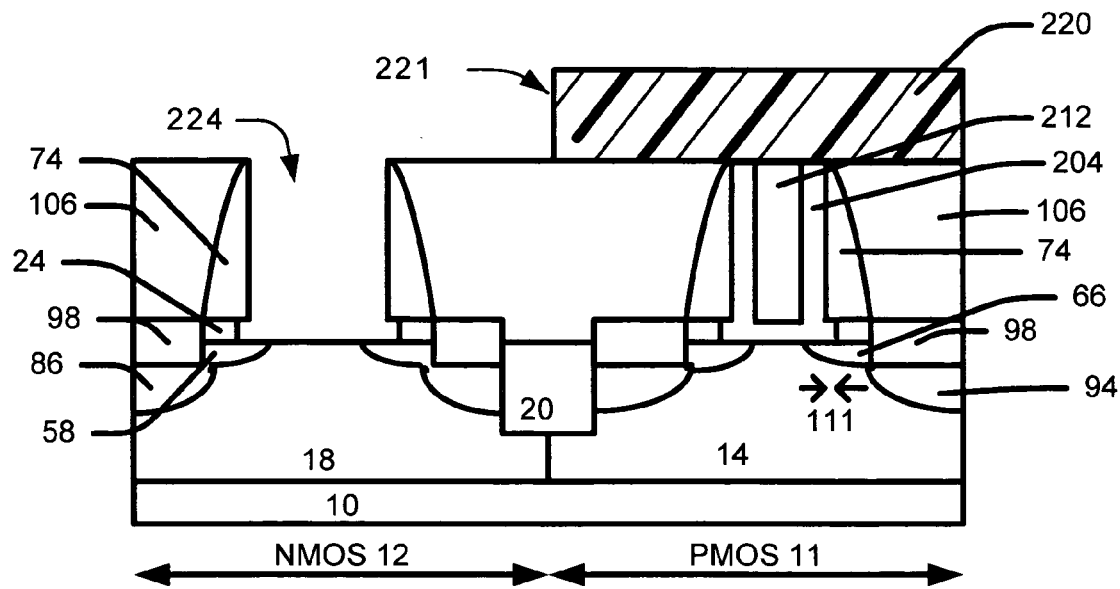

Referring to FIG. 21, we form a NMOS poly etch mask 220 having an NMOS poly opening 221 over the NMOS area 12.

Then we remove the NMOS sacrificial gate 36 and portions of the bottom pad dielectric layer 24 to form a NMOS gate openings 224 that expose portions of the bottom pad dielectric layer 24.

Subsequently, we remove the exposed portions of the bottom pad dielectric layer 24 in the NMOS gate openings 224.

Figure 22:
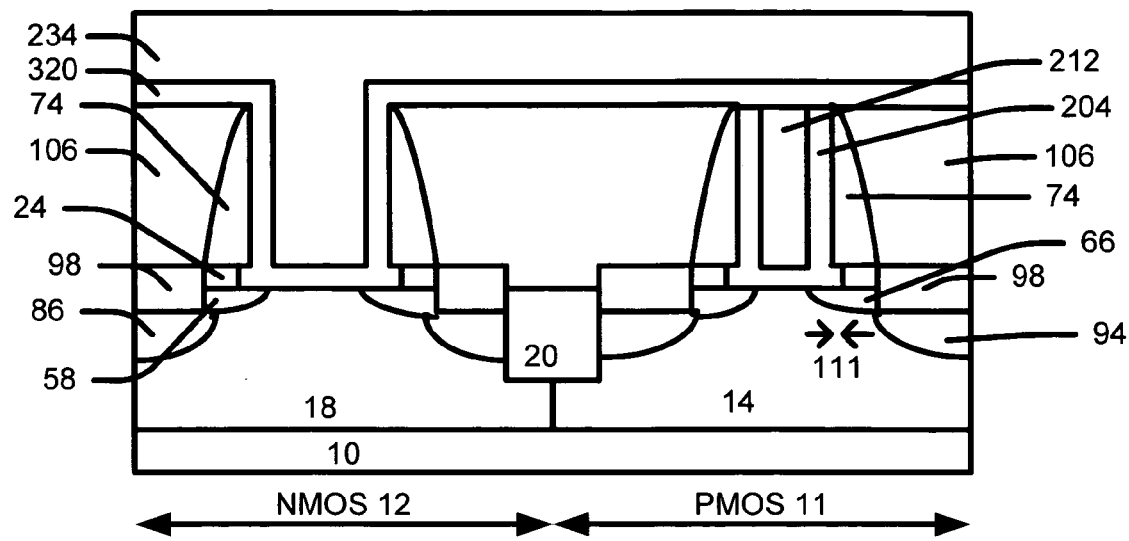
Figure 23:
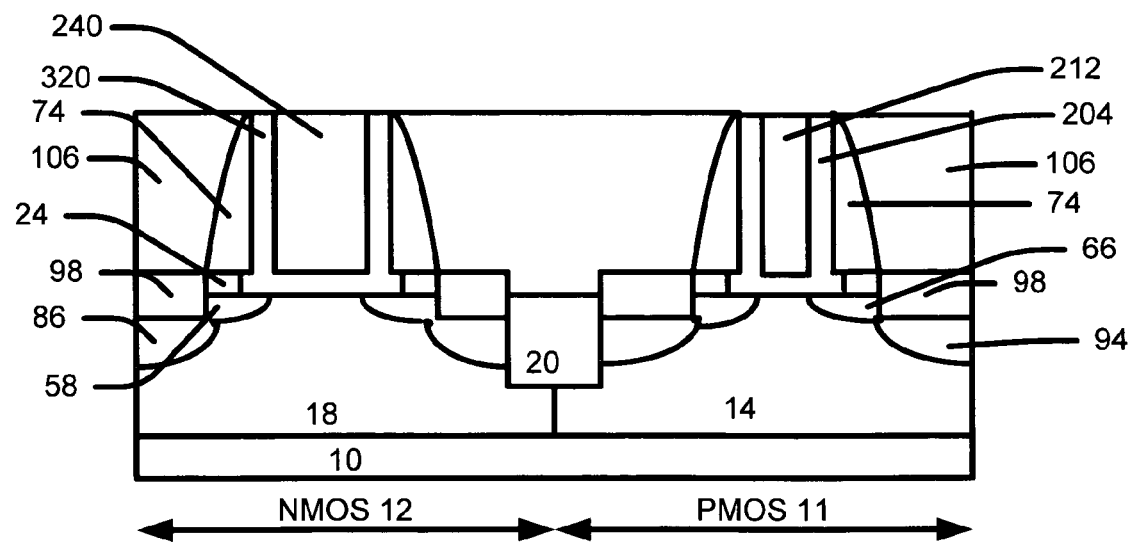

As shown in FIG. 22, we form a NMOS gate dielectric layer 230 over the substrate in the gate openings 202.

We form a second metal layer 234 over the NMOS gate dielectric layer 230 and filling the NMOS gate openings 224.

We then planarize the second metal layer 234 to form a NMOS gate 240 in the NMOS gate openings 224. The second metal layer 234 is preferably planarized by a chemical-mechanical polish (CMP) process stopping on the dielectric layer 106.

The second metal layer 234 preferably is comprised of a different metal composition than the first metal layer.

Preferably the NMOS gate 240 and the PMOS gate 212 have different work functions. Preferably the NMOS gate 240 is comprised of a material that has a lower work function than the PMOS gate 212. Preferably the NMOS gate 240 is comprised of a metal that has a lower work function than the PMOS gate 212.

Preferably the NMOS gate 240 is comprised of W, TiN, TiSi$_2$, CoSi2, NiSi or other metals or schemes such as metals implanted or sputtered with Nitrogen. The PMOS gate 212 can be comprised of materials similar to the NMOS gate. W, TiN, TiSi$_2$, CoSi2, or NiSi or other metals.

The PMOS gate 212 is narrower than the NMOS gate 240 because of the enhanced oxidation of the PMOS sacrificial gate 32 during the trimming step.

For example the PMOS gate 212 can have a width between 100 and 3400 Å and the NMOS gate 240 can have a width between 100 and 3500 Å.

For example, the PMOS gate width is preferably between 5 and 50% narrower than the NMOS gate width and is most preferably between 5 and 30% narrower.

Some aspects of the first and second embodiments form NMOS and PMOS devices different offset spacer widths (PMOS spacers 46 vs NMOS spacers 50) using selective oxidation. The embodiment improves short channel effects for PMOS Tx due to reduction of lateral diffusion of the boron. The embodiments can extend the limitation of lithography via oxidation trimming of sacrificial gates. Some aspects of the embodiments can reduced gate overlap capacitance for a T-Gate transistor via a replacement gate process flow.

Figure 24A:
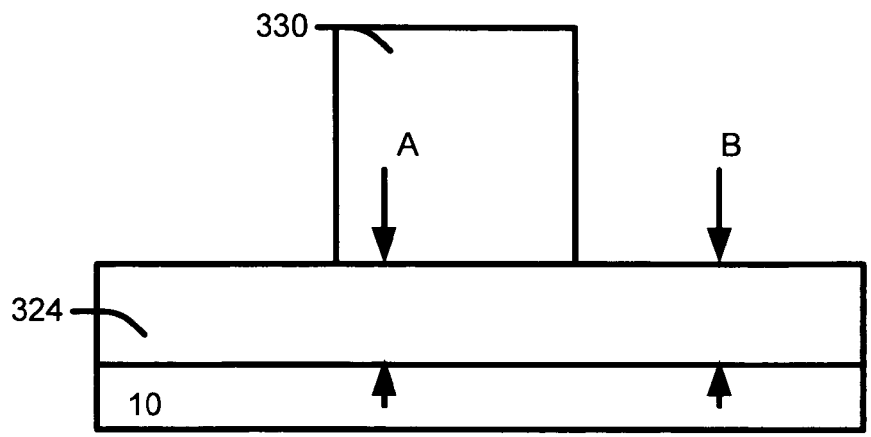
FIGS. 24A, 24B, 24C and 24D are cross sectional views showing a process that creates excessive under cutting of the pad dielectric layer.
Figure 24B:
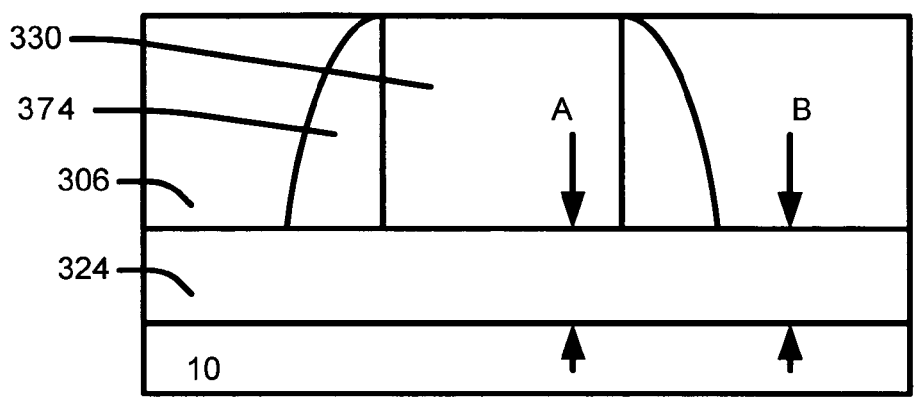
Figure 24C:
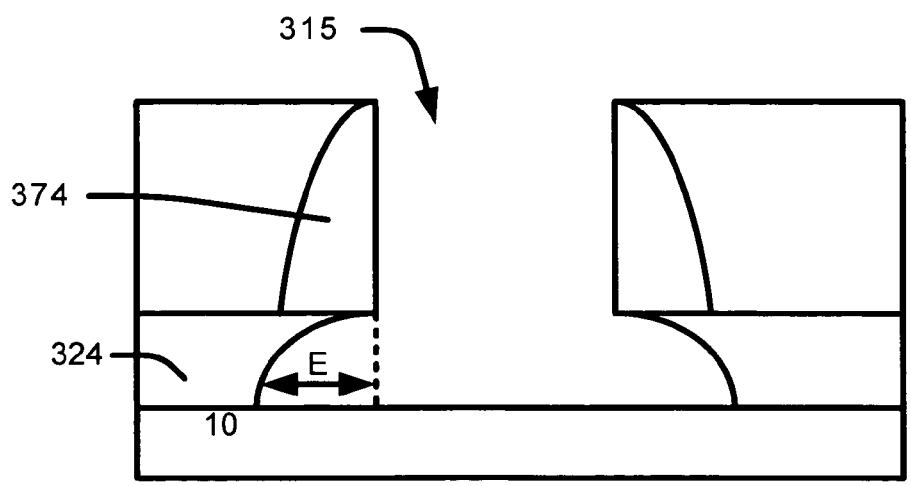

Reducing Undercut of Pad Dielectric Layer—Reduce Device Capacitance Steps Showing Excessive Undercutting FIGS. 24A thru 24C show an example process known to the inventors (not admitted prior art) that shows a problem of etch undercutting the pad dielectric layer (See especially FIG. 24C). FIG. 24A shows a pad dielectric layer 324 that typically has a thickness (A or B) of between 55 and 400 Å. The pad dielectric layer 324 is typically thicker than the embodiment's pad dielectric layer because more margin for the poly etch is needed by the example process. In contrast, a pad dielectric layer of the embodiment preferably has a thickness between 50 and 200 Å.

A sacrificial gate 330 is formed on the pad dielectric layer.

Referring to FIG. 24B, spacers 374 are formed. Then, a dielectric layer (e.g., PMD) 306 is deposited and polished back Referring to FIG. 24C, the sacrificial gate 330 is removed in gate opening 315.

Next, in a problem causing step, the pad oxide 324 over the channel region is removed using a wet etch. The etch removes a width E of pad oxide 324 underneath the spacers 374. The width E of oxide 324 removed is typically between 50 and 400 Å. An isotropic etch can remove about the same amount laterally as vertically.

Figure 24D:
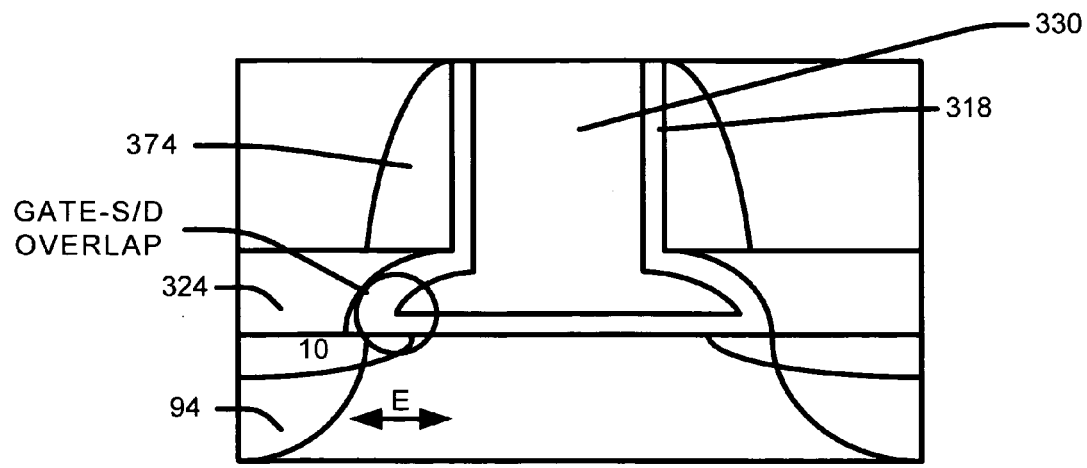

FIG. 24D shows the device with further processing. A gate dielectric layer 318 and gate 326 are formed. The device has more gate overlap capacitance because the undercut E allows a bigger area of LDD and S/D region under the gate.

Embodiment's Steps Showing Less Undercut

Figures 1, 25A:
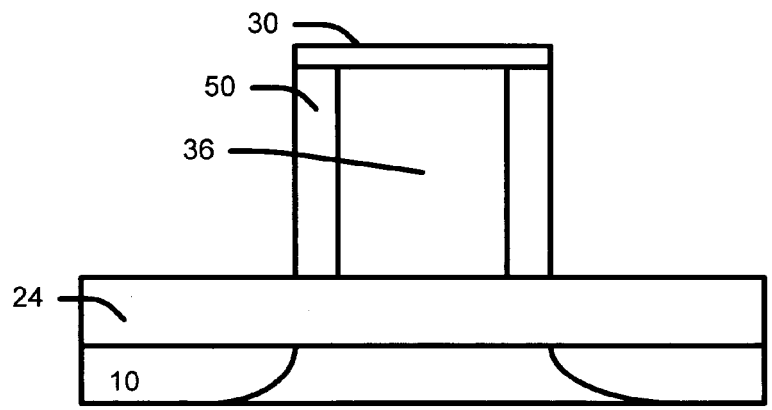
Figures 2, 25A:
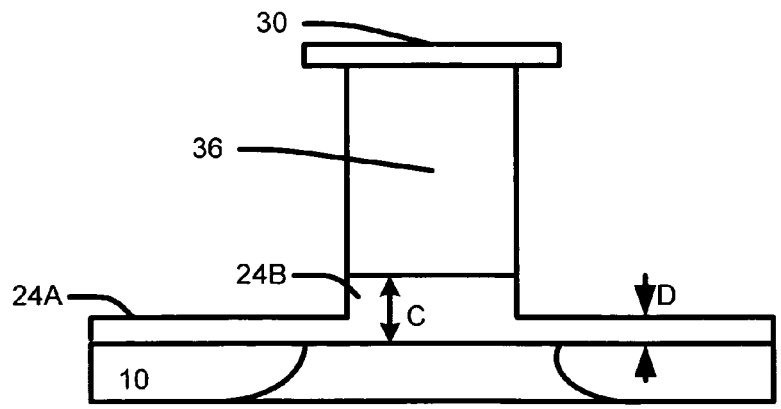
Figure 25B:
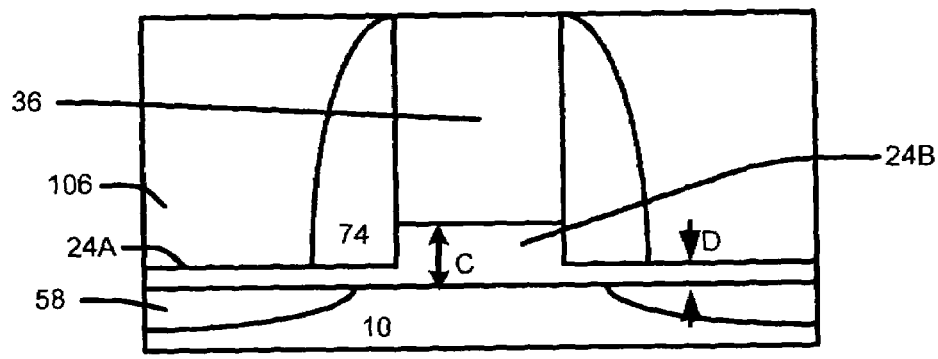

Referring to FIG. 25A-1 (also see FIG. 6), the PMOS and/or NMOS spacers 50 are formed on the sacrificial gate 36. The hard mask 30 is over the sacrificial gate 36. The steps described below apply to both PMOS and NMOS devices.

Referring to FIG. 25A-2, in an embodiment's process, in a key step, the pad dielectric 24 is etched back and thinned during the pad dielectric thinning step. For example, the pad dielectric under the gate (24B) has a thickness C of between 50 and 400 Å and more preferably between 50 and 200 Å. The pad dielectric 24A outside the gate, after the pad dielectric thinning etch, can have a thickness D between 10 and 120 Å.

After the embodiments pad dielectric layer thinning step, the pad dielectric layer (24A) outside the sacrificial gate has a thickness D preferably between 30% and 90% and more preferably between 50 and 66% of the thickness C of the unthinned pad dielectric layer (24B) (e.g., under the sacrificial gate). But because the thinned pad dielectric layer 24A is below the spacer 74, the lateral etch rate is slower and therefore less undercut.

Figure 25C:
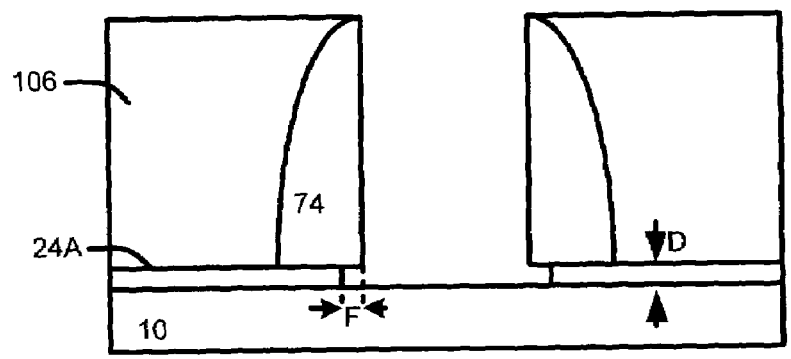

Referring to FIG. 25C, the sacrificial gate 32 is removed. Next, the pad oxide 24 over the channel region is removed using a wet etch. The etch removes a narrow width F of pad oxide 24A underneath the spacers. The width F of oxide 24 removed is typically between 20 and 120 Å. and more preferably between 40 and 100 Å. Usually, an isotropic etch can remove about the same amount laterally as vertically. But because of a thinner layer 24A (thickness D), the lateral etch rate is slower than the vertical etch rate.

Figure 25D:
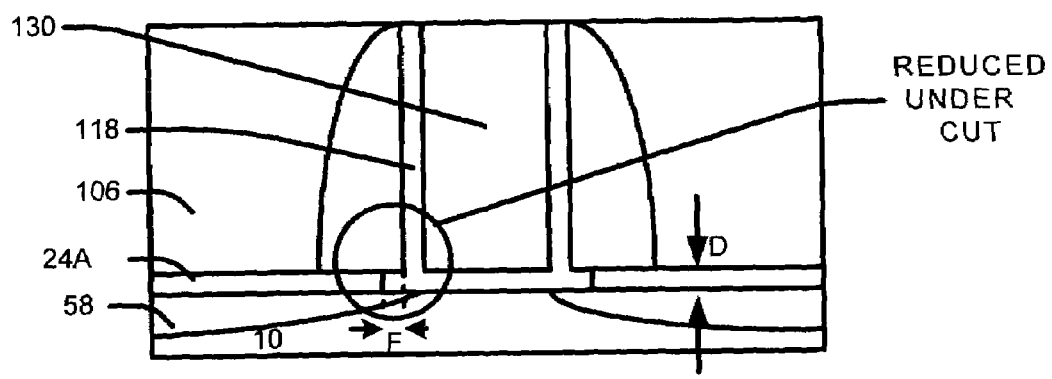

FIG. 25D shows the device with further processing. A gate dielectric layer 118 and gate 130 are formed. The embodiment's steps reduce undercut (e.g., width F) (less space between the gate and S/D) and thus reduce capacitance ($C_{overl}$).

The above advantages and features are of representative embodiments only, and are not exhaustive and/or exclusive. They are presented only to assist in understanding the invention. It should be understood that they are not representative of all the inventions defined by the claims, to be considered limitations on the invention as defined by the claims, or limitations on equivalents to the claims. For instance, some of these advantages may be mutually contradictory, in that they cannot be simultaneously present in a single embodiment. Similarly, some advantages are applicable to one aspect of the invention, and inapplicable to others. Furthermore, certain aspects of the claimed invention have not been discussed herein. However, no inference should be drawn regarding those discussed herein relative to those not discussed herein other than for purposes of space and reducing repetition.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Given the variety of embodiments of the present invention just described, the above description and illustrations show not be taken as limiting the scope of the present invention defined by the claims.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method of fabrication of a semiconductor device comprising steps of:
   a) forming a bottom pad dielectric layer and a silicon containing layer over a substrate; said bottom pad dielectric layer has a first thickness;
   b) patterning the silicon containing layer to form a sacrificial gate;
   c) performing a sacrificial gate amorphization implant by implanting ions into said sacrificial gate to form an amorphous layer;
   d) thermally oxidizing said sacrificial gate, and said amorphous layer to form sacrificial spacers on the sidewalls of said sacrificial gate;
   e) performing a LDD implant to form LDD regions adjacent to said sacrificial gate;
   f) in a bottom pad dielectric thinning step, removing the sacrificial spacers and removing a thickness of said bottom pad dielectric layer so that said bottom pad dielectric layer has a second thickness;
   g) forming spacers on said sacrificial gate;
   i) performing a S/D implant to form S/D regions adjacent to said sacrificial gate;
   j) forming a dielectric layer over said substrate;
   k) planarizing said dielectric layer to expose said sacrificial gate;
   l) removing said sacrificial gate to form a gate opening that expose an exposed portion of said bottom pad dielectric layer;
   m) removing the exposed portion of said bottom pad dielectric layer in said gate opening;
   n) forming a gate dielectric layer on said substrate that is exposed in said gate opening;
   o) forming a gate in said gate opening over said gate dielectric layer.

2. The method of claim 1 wherein the second thickness of said bottom pad dielectric layer is between 30% and 90% of the first thickness.

3. The method of claim 1 wherein the second thickness of said bottom pad dielectric layer is between 50 and 66% of the first thickness.

4. The method of claim 1 wherein the bottom pad dielectric thinning step, further comprises using an isotropic etch.

5. The method of claim 1 wherein the bottom pad dielectric thinning step, further comprises using an wet etch.

6. A method of fabrication of a semiconductor device comprising steps of:
   a) providing a substrate with a PMOS area and a NMOS area;
   b) forming a bottom pad dielectric layer and a polysilicon layer over said substrate;
   c) patterning the polysilicon layer to form a PMOS sacrificial gate and a NMOS sacrificial gate; said PMOS sacrificial gate in said PMOS area; said NMOS sacrificial gate in said NMOS area;
   d) performing a PMOS sacrificial gate amorphization implant by implanting ions into said PMOS sacrificial gate to form an amorphous layer;
   e) thermally oxidizing said PMOS sacrificial gate, said amorphous layer and said NMOS sacrificial gate to form NMOS sacrificial spacers on sidewalls of said NMOS sacrificial gate and PMOS sacrificial spacers on sidewalls of said PMOS sacrificial gate; said PMOS sacrificial spacers are thicker than said NMOS sacrificial spacers;

f) performing a NMOS LDD implant to form N-LDD regions adjacent to said NMOS sacrificial gate;

g) performing a PMOS LDD implant form to P-LDD regions adjacent to said PMOS sacrificial gate;

h) in a bottom pad dielectric thinning step, removing the PMOS sacrificial spacers and the NMOS sacrificial spacers and removing portions of the bottom pad dielectric layer;

i) forming NMOS spacers on said NMOS sacrificial gate and PMOS spacers on said PMOS sacrificial gate;

k) performing a NMOS S/D implant to form NMOS S/D regions adjacent to said NMOS sacrificial gate;

l) performing a PMOS S/D implant to form PMOS S/D regions adjacent to said PMOS sacrificial gate;

m) forming a dielectric layer over said substrate;

n) planarizing said dielectric layer to expose said PMOS sacrificial gate and said NMOS sacrificial gate;

o) removing said PMOS sacrificial gate and NMOS sacrificial gate to form gate openings that expose portions of said bottom pad dielectric layer;

p) removing the exposed portions of said bottom pad dielectric layer in said gate openings to expose said substrate in said gate openings;

q) forming a gate dielectric layer on said substrate that is exposed in said gate openings;

r) forming a PMOS gate in the gate opening in said PMOS area and a NMOS gate in the gate opening in said NMOS area.

7. The method of claim 6 wherein the PMOS sacrificial gate amorphization implant comprises implanting Si or Ge ions at an angle into said PMOS sacrificial gate.

8. The method of claim 6 which further comprises: forming a n-well in said PMOS area and a p-well in said NMOS area in said substrate.

9. The method of claim 6 wherein said the PMOS sacrificial spacers are between 100 and 500% thicker than the NMOS sacrificial spacers.

10. The method of claim 6 wherein said polysilicon layer is comprised of Si and Ge.

11. The method of claim 6 wherein said bottom pad dielectric layer in step b) is comprised of oxide and has a thickness between 50 and 400 Å.

12. The method of claim 6 wherein the polysilicon layer has a thickness between 1000 and 2000 Å.

13. The method of claim 6 wherein said NMOS sacrificial spacers have thickness between 50 and 2500 Å and said PMOS sacrificial spacers have a thickness between 100 and 5000 Å.

14. The method of claim 6 wherein said NMOS gate or said PMOS gate is formed by a CVD process and is comprised of a material selected from the group consisting of metal, W, TiN, TiSi$_2$, CoSi$_2$, NiSi and HfN.

15. The method of claim 6 wherein the bottom pad dielectric thinning step removes between 30 and 90% of the bottom pad dielectric thickness.

16. The method of claim 6 wherein the bottom pad dielectric thinning step removes between 50 and 66% of the bottom pad dielectric thickness.

17. The method of claim 6 wherein in step h), before the bottom pad dielectric thinning step, the bottom pad dielectric layer has a thickness between 50 and 400 Å and after the bottom pad dielectric thinning step, an exposed-portion of the bottom pad dielectric layer has a thickness between 20 and 120 Å.

18. The method of claim 6 wherein in step h), after the bottom pad dielectric thinning step, an exposed portion of the bottom pad dielectric layer has a thickness between 20 and 120 Å.

19. The method of claim 6 wherein said PMOS gate has a width between 5 and 30% of a width of said NMOS gate.

20. The method of claim 6 wherein said PMOS gate has a width between 5 and 50% a width of said NMOS gate.

21. A method of fabrication of a semiconductor device comprising steps of:

a) forming a n-well in PMOS area and a p-well in a NMOS area in a substrate;

b) forming isolation regions in said substrate;

c) forming a bottom pad dielectric layer, a polysilicon layer and a hard mask layer over said substrate;

d) patterning the polysilicon layer and the hard mask layer to form a PMOS sacrificial gate, a PMOS hard mask, a NMOS sacrificial gate and NMOS hard mask;

e) forming a PMOS mask over the substrate with an opening over the PMOS area;

f) perform a PMOS sacrificial gate amorphization implant by implanting ions into said PMOS sacrificial gate to form an amorphous layer; whereby the implant increases an oxidation rate of the PMOS sacrificial gate;

g) removing the PMOS mask;

h) thermally oxidizing said PMOS sacrificial gate and NMOS sacrificial gate to form NMOS sacrificial spacers on sidewalls of said NMOS sacrificial gate and PMOS sacrificial spacers on sidewalls of said PMOS sacrificial gate; said PMOS sacrificial spacers are thicker than said NMOS sacrificial spacers;

i) forming a NMOS LDD Mask over the substrate with an opening over the NMOS area;

j) performing a NMOS LDD implant to form N-LDD regions adjacent to said NMOS sacrificial gate;

k) performing a pocket implant in said NMOS area to form a pocket NMOS region;

l) remove said NMOS LDD Mask;

m) forming a PMOS LDD Mask over the substrate with an opening over the PMOS area;

n) performing a PMOS LDD implant to form P-LDD regions adjacent to said PMOS sacrificial gate;

o) performing a pocket implant in said PMOS area to form a PMOS pocket regions;

p) removing said PMOS LDD mask;

q) in a bottom pad thinning dielectric layer step, removing the PMOS sacrificial spacers and NMOS sacrificial spacers and removing exposed portions of the bottom pad dielectric layer;

r) forming a spacer dielectric layer over the substrate;

s) anisotropically etching said spacer dielectric layer to form NMOS spacers on said NMOS sacrificial gate and PMOS spacers on said PMOS sacrificial gate;

t) forming a NMOS S/D mask having an opening over said NMOS area;

u) performing a NMOS S/D implant to form NMOS S/D regions adjacent to said NMOS sacrificial gate;

v) removing said NMOS S/D mask;

w) forming a PMOS S/D mask having an opening over said PMOS area;

x) performing a PMOS S/D implant to form PMOS S/D regions adjacent to said PMOS sacrificial gate;

y) removing said PMOS S/D mask;

z) annealing said substrate to activate dopants in said PMOS S/D regions and said NMOS S/D regions;
aa) forming suicide on said PMOS S/D regions and said NMOS S/D regions;
bb) forming a dielectric layer over said substrate;
cc) planarizing said dielectric layer to remove said PMOS hard mask and said NMOS hard mask to expose said PMOS sacrificial gate and said NMOS sacrificial gate;
dd) removing said PMOS sacrificial gate and said NMOS sacrificial gate to form gate openings that expose portions of said bottom pad dielectric layer;
ee) removing the exposed portions of said bottom pad dielectric layer in said gate openings to expose said substrate in said gate openings;
ff) forming a gate dielectric layer on said substrate that is exposed in said gate openings;
gg) forming a gate layer over said gate dielectric layer in said gate openings; and
hh) planarizing said gate layer to form a PMOS gate and a NMOS gate.

22. The method of claim 21 wherein said NMOS sacrificial spacers have thickness between 50 and 500 Å and said PMOS sacrificial spacers have a thickness between 100 and 500 Å.

23. The method of claim 21 wherein said the PMOS sacrificial spacers are between 100 and 500% wider than the NMOS sacrificial spacers.

24. The method of claim 21 wherein said polysilicon layer is comprised of Si and Ge.

25. The method of claim 21 wherein said bottom pad dielectric layer in step c) comprised of oxide and has a thickness between 50 and 400 Å.

26. The method of claim 21 wherein the polysilicon layer has a thickness between 1000 and 2000 Å.

27. The method of claim 21 wherein said gate layer formed by a CVD process and is comprised of a material selected from the group consisting of metal, W, TiN, $TiSi_2$, $CoSi_2$, NiSi and HfN.

28. The method of claim 21 wherein the bottom pad dielectric thinning step removes between 30 and 90% of the bottom pad dielectric thickness.

29. The method of claim 21 wherein the bottom pad dielectric thinning step removes between 50 and 66% of the bottom pad dielectric thickness.

30. The method of claim 21 wherein in step q), before the bottom pad dielectric thinning step, the bottom pad dielectric layer has a thickness between 50 and 400 Å and after the bottom pad dielectric thinning step, an exposed portion of the bottom pad dielectric layer has a thickness between 20 and 120 Å.

31. The method of claim 21 wherein in step q) after the bottom pad dielectric thinning step, an exposed portion of the bottom pad dielectric layer has a thickness between 20 and 120 Å.

32. The method of claim 21 wherein said PMOS gate has a width between 5 and 30% of a width of said NMOS gate.

33. The method of claim 21 wherein said PMOS gate has a width between 5 and 50% of a width of said NMOS gate.

34. A method of fabrication of a semiconductor device comprising steps of:
a) providing a substrate with a PMOS area and a NMOS area;
b) forming a bottom pad dielectric layer and a polysilicon layer over said substrate;
c) patterning the polysilicon layer to form a PMOS sacrificial gate and a NMOS sacrificial gate; said PMOS sacrificial gate in said PMOS area; said NMOS sacrificial gate in said NMOS area;
d) performing a PMOS sacrificial gate amorphization implant by implanting ions into said PMOS sacrificial gate to form an amorphous layer;
e) thermally oxidizing said PMOS sacrificial gate, said amorphous layer and said NMOS sacrificial gate to form NMOS sacrificial spacers on sidewalls of said NMOS sacrificial gate and PMOS sacrificial spacers on sidewalls of said PMOS sacrificial gate; said PMOS sacrificial spacers are thicker than said NMOS sacrificial spacers;
f) performing a NMOS LDD implant to form N-LDD regions adjacent to said NMOS sacrificial gate;
g) forming a PMOS LDD mask over the substrate with an opening over the PMOS area;
h) performing a PMOS LDD implant to form P-LDD regions adjacent to said PMOS sacrificial gate;
i) in a bottom pad dielectric thinning step, removing the PMOS sacrificial spacers and the NMOS sacrificial spacers;
j) forming NMOS spacers on said NMOS sacrificial gate and PMOS spacers on said PMOS sacrificial gate;
l) performing a NMOS S/D implant to form NMOS S/D regions adjacent to said NMOS sacrificial gate;
m) performing a PMOS S/D implant to form PMOS SD regions adjacent to said PMOS sacrificial gate;
n) forming a dielectric layer over said substrate;
o) planarizing said dielectric layer to expose said PMOS sacrificial gate and said NMOS sacrificial gate;
p) forming a PMOS poly etch mask having an PMOS poly opening over said PMOS area;
q) removing said PMOS sacrificial gate and portions of said bottom pad dielectric layer to form a PMOS gate opening that exposes portions of said bottom pad dielectric layer;
r) removing the exposed portions of said bottom pad dielectric layer in said PMOS gate opening to expose said substrate in said PMOS gate opening;
s) forming a PMOS gate dielectric layer over said substrate that is exposed in said PMOS gate opening;
t) forming a first metal layer filling said PMOS gate opening;
u) planarizing said first metal layer to form a PMOS gate in said PMOS gate opening;
v) forming a NMOS poly etch mask having an NMOS poly opening over said NMOS area;
w) removing said NMOS sacrificial gate and portions of said bottom pad dielectric layer to form a NMOS gate opening that exposes portions of said bottom pad dielectric layer;
x) removing the exposed portions of said bottom pad dielectric layer in said NMOS gate opening to expose said substrate in said NMOS gate opening;
y) forming a NMOS gate dielectric layer over said substrate that is exposed in said NMOS gate opening;
z) forming a second metal layer over said NMOS gate dielectric layer and filling said NMOS gate opening;
aa) planarizing said second metal layer to form a NMOS gate in said NMOS gate opening.

35. The method of claim 34 wherein said NMOS gate has a different work function than said PMOS gate.

36. The method of claim 34 wherein said NMOS gate has a lower work function than said PMOS gate.

37. The method of claim 34 wherein the bottom pad dielectric thinning step removes between 30 and 90% of the bottom pad dielectric thickness.

38. The method of claim 34 wherein the bottom pad dielectric thinning step removes between 50 and 66% of the bottom pad dielectric thickness.

39. The method of claim 34 wherein in step i), before the bottom pad dielectric thinning step, the bottom pad dielectric layer has a thickness between 50 and 400 Å and after the bottom pad dielectric thinning step, an exposed portion of the bottom pad dielectric layer has a thickness between 20 and 120 Å.

40. The method of claim 34 wherein in step i), after the bottom pad dielectric thinning step, an exposed portion of the bottom pad dielectric layer has a thickness between 20 and 120 Å.

41. The method of claim 34 wherein said PMOS gate has a width of between 5 and 50% narrower than said NMOS gate.

* * * * *